United States Patent [19]

Johnson

[11] Patent Number: 4,765,726

[45] Date of Patent: Aug. 23, 1988

[54] FRESNEL SCROLL SOLAR TRACKING DEVICE

[76] Inventor: Kenneth C. Johnson, 1215 Brewster Dr., El Cerrito, Calif. 94530

[21] Appl. No.: 148,497

[22] Filed: Jan. 26, 1988

Related U.S. Application Data

[63] Continuation-in-part of Ser. No. 868,306, May 28, 1986.

[51] Int. Cl.$^4$ ............................ F24J 3/02; G02B 3/08
[52] U.S. Cl. .................................... 350/452; 126/440; 350/167
[58] Field of Search ............... 126/424, 425, 426, 435, 126/440; 350/167, 452, 443

[56] References Cited

U.S. PATENT DOCUMENTS

| | | | |
|---|---|---|---|
| 4,056,309 | 11/1977 | Harbison et al. | 126/424 |
| 4,134,393 | 1/1979 | Stark et al. | 126/440 |
| 4,289,118 | 9/1981 | Stark | 126/440 |
| 4,312,709 | 1/1982 | Stark et al. | 126/440 |
| 4,456,783 | 6/1984 | Baker | 350/443 |
| 4,553,531 | 11/1985 | Rosende | 126/440 |
| 4,672,948 | 6/1987 | Rosende | 126/440 |

OTHER PUBLICATIONS

Dudley et al., "Performance Testing of the FMC Fresnel-Belt Concentrating Solar Collector," Report Sand 80-001, Sandia National Laboratories, 1980, pp. 2-11, 29.

Primary Examiner—John K. Corbin
Assistant Examiner—Martin Lerner

[57] ABSTRACT

A "Fresnel Scroll" is an optical mechanism which functions as a tracking element (and also, in its preferred embodiments, as a focusing element) in a tracking solar collector system. The device comprises a long, flexible film of transparent optical material, a portion of which is supported in tension over an aperture region, with portions of the film outside of the aperture region stowed compactly on two adjoining storage reels. An incident beam impinging on the film is redirected by means of Fresnel facets distributed over the film surface. The facet structure varies nonuniformly along the film's length dimension, so that the device's optical function can be dynamically varied in response to changes in the incident beam direction by scrolling the film across the aperture, feeding it from one reel to the other. By this means, a Fresnel Scroll may operate in conjunction with other elements of a collector system to concentrate a beam of sunlight of varying direction onto a point- or line-focus receiver.

4 Claims, 7 Drawing Sheets

FRESNEL SCROLL SOLAR TRACKING DEVICE

CROSS REFERENCE TO RELATED APPLICATION

This is a continuation-in-part of application Ser. No. 06/868,306, filed 05/28/86.

OTHER REFERENCES

1. Proceedings of the ERDA Conference on Concentrating Collectors, Georgia Institute of Technology, Atlanta, 1977.
2. Ari Rabl, "Active Solar Collectors and Their Applications", New York, Oxford University Press, 1985.
3. Dudley, V. E. and Workhoven, R. M., "Performance Testing of the FMC Fresnel-Belt Concentrating Solar Collector", Report SAND 80-0011, Sandia National Laboratories, Albuquerque, NM, 1980.
4. U.S. Pat. No. 4,456,783, Baker, 6/26/84.

BACKGROUND OF THE INVENTION

1. Field of the invention

This invention pertains to the tracking, collection, and concentration of direct sunlight by optical and mechanical means, for the purpose of solar energy utilization. The invention may be employed in conjunction with any one of several known means of solar energy utilization, such as thermally-powered production of mechanical or electrical energy, direct photovoltaic generation of electrical energy, or illumination of core building spaces using beamed or piped daylight.

2. Description of prior art

Solar collector types are broadly classified as non-tracking (stationary) or tracking (movable). Tracking collectors are classified as "one-axis" or "two-axis" trackers, according to the number of mechanical degrees of freedom employed by the tracking mechanism. [The tracking motion is usually rotational, but we will also apply this classification when non-rotational (e.g., translational) motion is employed.] Tracking collectors usually function to collect direct sunlight entering a large entrance aperture and concentrate it into an exit aperture (i.e., a receiver aperture) of significantly smaller area dimension. The maximum attainable area concentration (ratio of entrance aperture area to exit aperture area) is limited by the number of mechanical degrees of freedom employed by the collector. Non-tracking collectors cannot practically attain concentration levels greater than few suns. A one-axis tracking collector can produce a line focus with much higher area concentration: For north-south (i.e., declination) tracking the theoretical maximum is about 170X; for east-west (i.e., ascension) tracking the limit is about 420X. A twoaxis system can produce a point focus with a theoretical area concentration limit of about 45,000X. [Greater concentration levels can be achieved if the receiver is immersed in a medium having a high refractive index. In addition, high concentration can in principle be attained without active tracking by using fluorescent optical materials which alter the color of the transmitted radiation, but fluorescent systems are not currently practical.]

Two-axis tracking collectors are usually pedestal-mounted on altitude-azimuth tracking bearings. Examples of such systems include heliostats and paraboloidal dish collectors. Due to the single-pedestal mounting's inherent instability and sensitivity to torque loading, it is difficult with these systems to achieve accurate tracking under normal wind loading conditions and to assure survivability under storm conditions without making the system's mechanical elements exceedingly massive, bulky, and expensive. One-axis tracking systems such as the parabolic trough and the linear Fresnel lens have improved mechanical stability, but at the expense of greatly reduced flux concentration.

A number of novel tracking mechanisms have been developed to attempt to overcome the mechanical difficulties encountered with conventional tracking systems. (See Ref. 1 and Chapter 7 in Ref. 2 for a review of novel tracking mechanisms.) The "SLATS" system uses a segmented array of parallel strip mirrors, each rotatable about its own independent axis, in place of a single monolithic mirror unit. Another device, the Fresnel-Belt Solar Collector, achieves one-axis tracking by scrolling a flexible Fresnel mirror across a stationary collector aperture (Ref. 3). The Multielement Optical Panel (Ref. 4) achieves one-axis tracking by making slight adjustments in the relative alignment of two parallel panels bearing linear lens arrays. Two other devices, the Fixed Mirror Solar Concentrator and Spherical Bowl Collector, achieve tracking by moving the receiver in relation to a stationary mirror.

The novel systems mentioned above have various merits in relation to conventional tracking systems, but they also have significant limitations (e.g., optical losses from shading and blocking, optical aberrations, stringent tolerances on surface geometry and mechanical positioning). A primary drawback of these systems is that they are all line-focus devices, and cannot compete with point-focus concentrators in terms of their achievable flux concentration.

SUMMARY OF THE INVENTION

Conventional tracking collectors achieve tracking by mechanically rotating the entire collector-receiver assembly in order to maintain a particular geometric relationship between the collector system and the incident beam. A "Fresnel Scroll", in contrast, achieves tacking by scrolling a thin, lightweight optical film across the collector aperture, allowing the collector aperture's and receiver's tracking motion to be either eliminated or substantially reduced relative to conventional systems.

FIG. 1 depicts a conceptual example of a Fresnel Scroll which illustrates how the invention operates. (The device is shown in two cross-sectional views representing different tracking configurations. For illustrative purposes, we will assume here that the optical surfaces are all perpendicular to the sectional plane of FIG. 1.) The Fresnel Scroll comprises a long flexible film F of transparent optical material on the surface of which are disposed Fresnel facets, with the facet angles varying continuously along F's length dimension. A section of F spans an aperture region, and portions of the film outside of this region are compactly rolled up on two storage reels R bordering the aperture. An incident ray r impinging on a particular aperture point p will be deflected into an output ray r', the direction of which is determined by the facet angle $\delta$ at p. By scrolling F across the aperture into a new position (see right-hand view in FIG. 1), the angle $\delta$ at the ray intercept point can be adjusted in response to a change in direction of r, so that the direction of r' can either be held fixed or limited to a restricted directional range as the direction of r varies over a large range. By this means, the device can operate to track an incident beam as it moves over a large range of directions and divert it into an output beam which either remains substantially stationary or is restricted to a much more limited directional range.

A Fresnel Scroll may function either as the only movable tracking element of a line-focus collector, or as one axis of a two-axis point-focus system (wherein the other axis could comprise a conventional one-axis rotational positioning mechanism or a second Fresnel Scroll.) Although a Fresnel Scroll functions primarily as a tracking element, in its preferred embodiments the device also pays a supplemental role as a focusing element, thereby eliminating the need for supplementary concentrating optics.

Collector systems employing Fresnel Scroll tracking elements would have a number of advantages in comparison to conventional systems. The primary advantage of a Fresnel Scroll is that it achieves tracking by moving a lightweight plastic film rather than a large, unwieldy mechanical assembly. Furthermore, in comparison to a conventional system such as an altitude-azimuth tracking mechanism, a Fresnel Scroll's tracking accuracy may be much less affected by mechanical positioning tolerance limitations since the drive mechanisms would typically be coupled directly to the Fresnel film (e.g., via a sprocketed timing belt), rather than being coupled to a small drive gear. Also, the mechanical configuration of a Fresnel Scroll system could allow a large number of tracking elements to be coupled to a common tracking drive, whereas conventional systems typically require a separate drive unit for each collector aperture.

A Fresnel Scroll would have the additional advantage of eliminating the receiver's motion or reducing its range of motion in comparison to conventional systems. This feature could provide several benefits: Plumbing connections in solar thermal receivers or fluid-cooled photovoltaic receivers could be simplified; and with daylighting systems the beam could be channeled into a stationary light guide or projected into a stationary directed beam without the use of auxiliary tracking optics. Also, elimination or reduction of the collector aperture's motion could eliminate or mitigate mechanical clearance limitations and shading interference between adjacent collector apertures, allowing the apertures to be closely spaced in dense arrays.

An issue which should be given special consideration is that of environmental exposure. A practical tracking collector must be designed to maintain adequate tracking accuracy under normal wind loading conditions, and must be survivable under storm conditions with 100 mile-per-hour winds. In addition, the system must tolerate the influence of dust, rain, hail, ultraviolet exposure, sand pitting, etc. Conventionally, these requirements are met by simply making the collector's mechanical components sufficiently robust and using environmentally resiliant materials. An alternative approach which could be practical with Fresnel Scroll systems would be to simply enclose the collector system under a protective glass roof. The glass would add to the system cost and would result in about 10% optical loss due to surface reflections; but elimination of environmental exposure could result in tremendous cost and performance advantages in the collector optics and mechanics, and a 10% optical loss could be offset by increasing the collector's aperture area by 10%. (The receiver aperture need not be enlarged, since the system's optical concentration could be increased slightly to balance the increased collector aperture area.)

DETAILED DESCRIPTION OF THE INVENTION

Terminology

Figure 1:
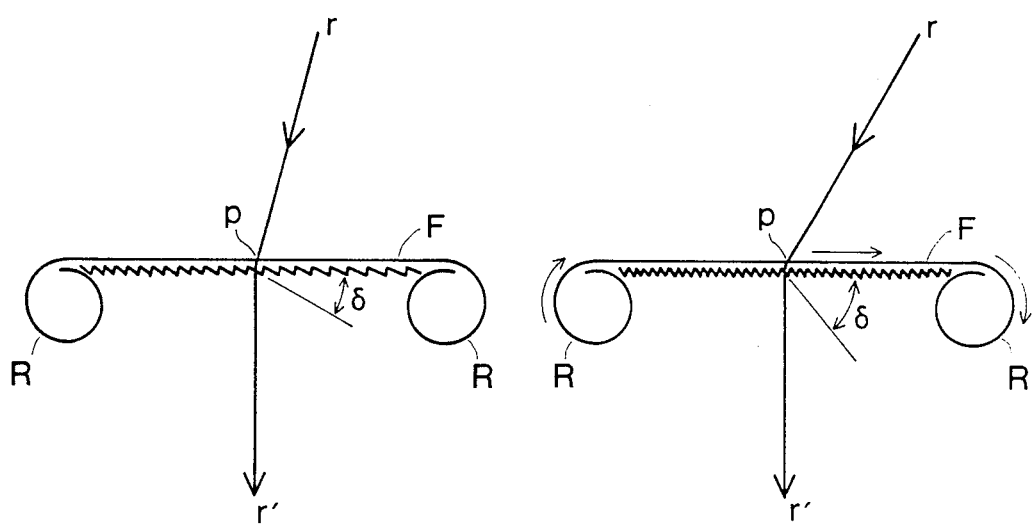
FIG. 1 illustrates a Fresnel Scroll in two different tracking configurations.

A "Fresnel lens" (or "Fresnel film", "Fresnel surface", etc.) is a thin optical film or sheet with narrow refracting facets disposed on one or both surfaces. The facets are conventionally arranged as parallel linear bands (in the case of a line-focus lens) or concentric annular rings (for a point-focus element), but a Fresnel Scroll's facet elements need not be restricted to the conventional linear or annular form. In the present context a Fresnel surface will be understood to be an optical surface having the following general characteristics: The surface is divided into a number of juxtaposed regions (facet faces and sidewalls) separated by sharp or small-radius boundary edges. The facet faces form smooth optical surfaces, the boundaries of which may have any convenient shape (e.g., straight or curved lines, circular or oval rings, small rectangles or hexagons, etc.). For a typical straight-profile facet structure, the surface orientation (i.e., surface-normal direction) would be constant over any transverse cross-section of a facet face. More general curved-profile facet structures may be employed, but the distribution of surface orientations over a facet face's transverse section would be limited to a very small directional range. In addition, any discontinuity in surface orientations between two adjacent facet faces would also be small. (In relation to the full range of facet orientations covered by a Fresnel lens, the range of surface orientations over a curved facet's transverse section and the orientation discontinuity between adjacent facets would typically be comparable to the ratio of the facet width to the lens aperture dimension.) Due to the latter two restrictions, the category of Fresnel surfaces excludes optical surfaces such as lens arrays (e.g., the "Multielement Optical Panel", Ref. 4), since each lens element in such an array incorporates a wide range of surface orientations and the orientation discontinuity across the boundary between adjacent lens elements is large.

Since any discontinuity of the surface orientations between two adjacent facets would generally be very slight, we may consider the facet orientation to be substantially continuous over the entire Fresnel surface. In defining the facet surface orientation at any particular point on a Fresnel element, it suffices to specify the incident and refracted directions of a particular ray which traverses the element at that point. If only one side of the element is faceted, these directions uniquely determine the facet surface orientation at that point. If both sides are faceted, a degree of freedom will exist in the surface orientations which may be used by the optical designer to meet other design requirements (such as minimizing optical transmittance losses and optical sensitivity to surface warpage, minimizing optical aberrations, or optimizing manufacturability).

The shapes of the facet boundaries on a Fresnel element are essentially irrelevant to its optical function (the element's optical function depends only on its distribution of facet surface orientations); so no consideration will be given to the facet boundary geometry in the following discussions.

The following discussion will rely heavily on the concept of an "n-parameter" set (e.g., a "one-parameter" set or a "two-parameter" set). Generally speaking, an n-parameter set is a set of entities which has the property that in order to specify any particular member of the set, n real numeric quantities must be specified. For example, a geometric curve is one-parameter set of points, since any designated point on the curve can be identified in terms of a single parameter such as the arc length along the curve from a fixed reference point to the designated point. A "surface" is a two-parameter set of points. The set of all incident beam directions within a solar collector's field of view constitutes a two-parameter set, since any particular beam direction can be identified in terms of two parameters such as altitude and azimuth angles, or ascension and declination. The set of distinct tracking configurations of an n-axis (e.g., 1-axis or 2-axis) tracking system constitutes an n-parameter set of mechanical configurations. (This criterion specifically defines an "n-axis" tracking system.)

[To be more specific, an n-parameter set may be defined as a set which can be parameterized in terms of n quantities. By this we mean that a continuous functional mapping can be defined which associates each sequence of n real numeric paramreters $(t_1, t_1, \ldots t_n)$ in some n-dimensional domain with a member of the set, wherein each member of the set is assigned a unique parameter sequence $(t_1, t_1, \ldots t_n)$. (The assigned parameter sequences serve as unique labels identifying distinct members of the set.) The functional association is "continuous" in the sense that if any of the parameters $t_1, t_1, \ldots t_n$ is changed by a slight increment, the associated member will also change only slightly. (For example, in the case of a parameterized set of collimated beams, the beam direction will change only slightly in response to a slight change in one of the parameters; or in the case of a set of mechanical configurations, the positions and orientations of all movable mechanical components will similarly change only slightly.)]

Tracking mechanism

We will now describe in greater detail the operation of the device discussed in Section 2 and illustrated conceptually in FIG. 1. Initially, we will only consider how the device can be made to track one particular ray (the ray r which intercepts a specific aperture point p; see FIG. 1) and deflect it into a ray r' which intercepts the receiver. Later, we will consider the system's optical performance over the entire aperture region.

Imagine that the direction of the ray r' in FIG. 1 is reversed, so that the Fresnel film F retracts a ray originating from below the aperture into a reversed ray r above F. By scrolling F across the aperture the facet orientation at the aperture point p intercepted by r' can be made to vary over a continuous one-parameter range, causing the direction of the deflected ray r to vary over a one-parameter range. Conversely, an incident ray r impinging on p from anywhere within some one-parameter directional range can be made to refract into a fixed ray r' by scrolling F into an appropriate position associated with the ray's incident direction. Hence, if we consider a one-parameter set of beams, each of which contains one of the aforementioned rays r intercepting p, the device can be configured to collect any incident beam within this one-parameter set and deflect at least one ray of the beam (the ray intercepting p) into a fixed ray r' intercepting a designated receiver point.

Figure 2:
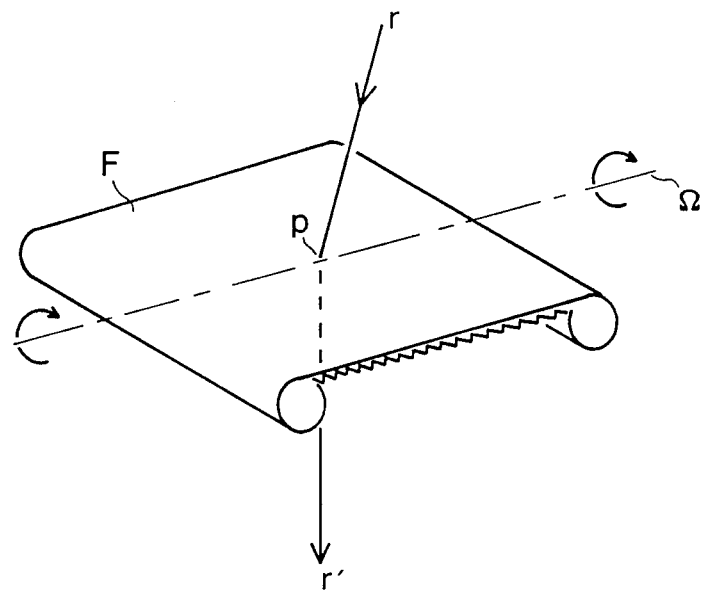
FIG. 2 illustrates a two-axis tracking mechanism comprising a Fresnel Scroll element which is rotatable about a mechanical axis $\Omega$.
Figure 3:
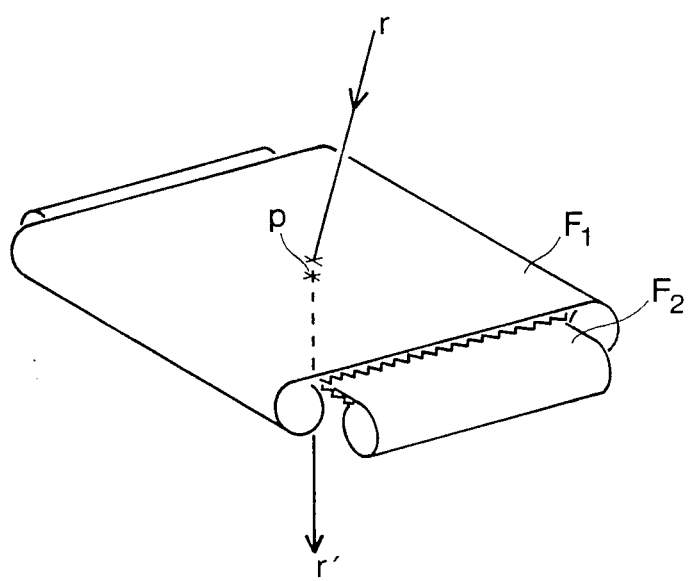
FIG. 3 illustrates a two-axis tracking mechanism comprising two Fresnel Scroll elements.

The mechanism described above cannot by itself constitute a point-focus tracking system since a solar collector must track a collimated incident beam over a two-parameter range of directions, whereas the above-described system can only track ray r over a one-parameter directional range. However, the device can operate in conjunction with a second tracking mechanism to provide two-axis tracking over a two-parameter directional range. FIGS. 2 and 3 conceptually illustrate a couple of methods by which this can be achieved. In FIG. 2, the entire collector-receiver assembly is mounted on a one-axis rotational positioning system which can rotate the assembly about an axis $\Omega$. In FIG. 3, a Fresnel element $F_1$ similar to the element F of FIG. 1 is placed over a second such element $F_2$ in a transverse orientation, so that the incident beam passes through both elements. The configurations illustrated in FIGS. 2 and 3 each have two mechanical degrees of freedom (film position and rotational orientation about $\Omega$ in FIG. 3, and the two film positions in FIG. 4). If we imagine that the direction of the ray r' intercepting aperture point p is reversed, the direction of the reversed ray r into which r' would be deflected could be scanned over a two-parameter directional range by adjusting the two tracking controls. Consequently, any collimated incident beam within some two-parameter directional range can, by properly adjusting the tracking configuration, be refracted in such a way that the particular ray r in the beam which intercepts aperture point p will be deflected into a ray r' intercepting the receiver point.

Figure 4:
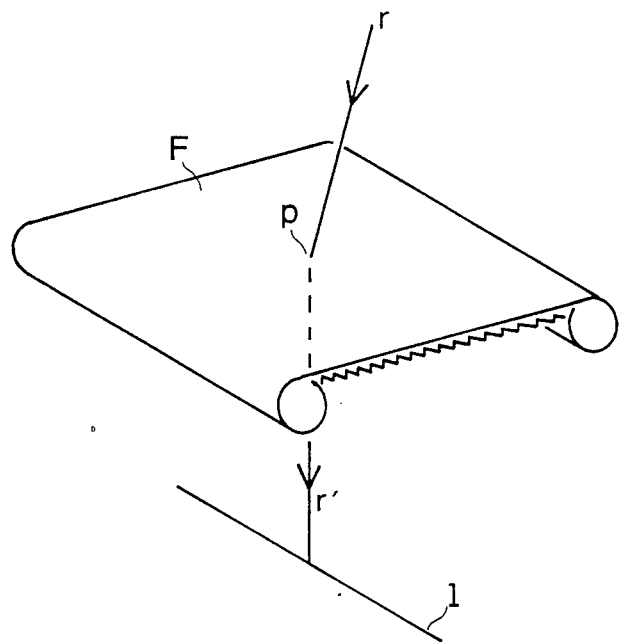
FIG. 4 illustrates a line-focus Fresnel Scroll element.

The top Fresnel element $F_1$ in FIG. 3 functions to collect any one of a two-parameter set of incident rays r and, by adjusting the position of the film $F_1$, direct it into one of a one-parameter set of rays intercepting p (the ray segment between $F_1$ and $F_2$) which can thence be deflected into a fixed ray r' by element $F_2$ as described previously. A Fresnel Scroll can also operate in this mode as the only movable element of a one-axis line-focus collector. FIG. 4 illustrates this mode of operation: Consider a ray r' which originates from a point p on F, and which intercepts a particular line l; wherein p and l are fixed relative to the collector aperture. All such rays r' constitute a one-parameter set. Reversing the direction of r', the ray will be deflected by F into a reversed ray r which can be made to scan a two-parameter directional range be varying the film position and the point where r' intercepts l. Conversely, an incident ray r impinging on p from anywhere within a two-parameter directional range can be deflected into some ray r' intercepting l by scrolling F into an appropriate position associated with the ray's incident direction. Thus, the device can be configured to collect any incident beam within a two-parameter directional range and deflect at least one ray r in the beam into a ray r' intercepting a designated line receiver.

Illustrative embodiment

Up to this point, we have only been considering the Fresnel Scroll's tracking performance for a single ray intercepting a particular aperture point. We will now illustrate a means by which the system's tracking performance can be extended over the entire collector aperture. This example is presented for demonstrative purposes only and is not intended to restrict the specification. More general and practical means by which the Fresnel Scroll can be configured to provide good tracking performance over the full aperture will be described later in this section and in the discussion of preferred embodiments in Section 5; but we will not attempt to explicitly define the full range of possible system designs because, as will be demonstrated by the following example, a fairly arbitrary facet structure can be made to provide good tracking performance (provided that the Fresnel film is sufficiently long in comparison to the aperture dimension).

For this design example, we will first specify a Fresnel Scroll structure which will refract any collimated incident beam into a deflected beam which is also substantially collimated. Consider an optical system similar to the Fresnel Scroll of FIG. 1, but which has the feature that the Fresnel element's facet surface orientation is constant over the entire aperture region. Under this condition, a collimated beam containing ray r would be deflected into a beam containing ray r' which would also be collimated. Of course, the surface orientation cannot be constant over the aperture, since the Fresnel Scroll could not perform its tracking function unless the facet structure varies along the film's length dimension. However, the deflected beam's collimation error can be made arbitrarily small by restricting the facet surface orientations over the aperture region to a sufficiently small directional range. This design objective can be achieved provided that no restriction is placed on the Fresnel film length. The latter condition is required because, whereas the range of surface orientations over any aperture-size region of the film must be restricted to a sufficiently small directional range, the range of surface orientations spanned by the entire film must be sufficiently great to allow the device to track the incident beam over a large directional range. The film length would need to be greater than the aperture dimension by a factor comparable to the ratio of the system's angular tracking range to the deflected beam's allowed collimation error range.

Figure 5:
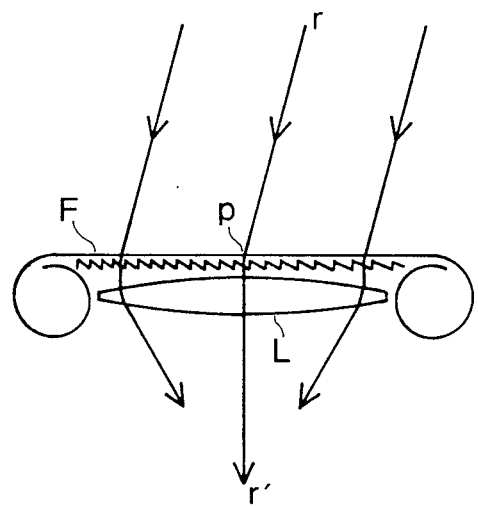
FIG. 5 illustrates a Fresnel Scroll element in conjunction with a focusing lens L.

By suitably restricting the range of facet surface orientations over any aperture-size region of the film, the Fresnel Scroll of FIG. 1 can be made to refract any collimated incident beam within its tracking range into a substantially collimated deflected beam containing ray r'. This beam can thence be focused onto the receiver by means of a focusing lens L (FIG. 5) whose axis coincides with r' (so that r' is undeviated by the lens), and whose focal point is located at the receiver point (so that a collimated beam containing r' will be focused onto the receiver point). By incorporating such a lens below the film element F of FIG. 2 or element $F_2$ of FIG. 3, these systems can be made to provide good point-focus tracking performance over the entire collector aperture. The line-focus system of FIG. 4 can be similarly modified to provide good line-focusing performance over the full collector aperture as follows: We incorporate a focusing lens below F, as illustrated in FIG. 5, with the center of the lens located very close to point p (so that any ray r' projecting from p through line l will be essentially undeviated by the lens), and with the len's focal plane containing l (so that any collimated beam containing one of the rays r' intercepting l will be focused onto l).

As illustrated by the above design approach, a Fresnel Scroll having a fairly arbitrary facet structure can perform its intended tracking function. (The only constraints placed on the facet structrue in the above examples are that the facet surface orientations over any aperture-size region of the film should be restricted to a suitably small range; and that the full range of surface orientations spanned by the entire film should be great enough to allow tracking over a large directional range.) We will therefore not attempt to specify in explicit geometric detail the range of facet structures allowed by all possible embodiments of the invention, but will instead define the invention in terms of some fairly general structural and functional specifications. (Section 5 discusses some very specific classes of facet geometries, however, which meet certain optimization conditions in terms of performance and practicality.)

The design approach discussed above exhibits less than ideal performance characteristics and is not very practical due to certain unduly limiting design restrictions. We will now consider some less restrictive design approaches which will yield substantial improvements in performance and practicality.

Generalizations

A primary drawback of the above design approach is that it requires that the facet nonuniformity be sufficiently limited over the aperture region to minimize decollimation of the deflected beam; whereas the tracking function requires that the facet structure be nonuniform along the film's length dimension. Consequently, the film must be excessively long. However, there is no fundamental reason why the deflected beam should have to be collimated. In the configuration of FIG. 2, for example, it is only necessary for the Fresnel Scroll to divert the incident beam into a beam which remains substantially fixed in relation to the collector aperture and receiver. This makes it possible to concentrate the beam onto the receiver by means of a focusing lens L (FIG. 5) whose design is tailored to the particular beam geometry produced by the Fresnel Scroll. Similarly, in the system of FIG. 3, neither the intermediate beam between $F_1$ and $F_2$ nor the output beam below $F_2$ need be collimated -it is only necessary that the two Fresnel elements operate in combination to produce an output beam which remains substantially fixed so that the beam can be concentrated onto the receiver by means of a fixed focusing lens. For the linefocus system of FIG. 4, the deflected beam also need not be collimated - it need only be restricted to some class of beams which can all be focused substantially onto 1 by means of an appropriately designed fixed focusing lens.

Rather than trying to minimize the facet structure's nonuniformity over the aperture region, the requisite nonuniformity along the film's length direction can be taken advantage of to provide partial focusing of the transmitted beam. In addition, although film's facet structure is uniform along the film's width dimension in the embodiments discussed above, the structure may more generally be nonuniform along the width dimension in order to provide additional focusing capability. The device's focusing capability may also be further improved by supporting the film on an aperture surface contour which is curved (e.g., cylindrical) rather than flat as in the above illustrations. (This could be accomplished by supporting the film in tension over curved guide rails crossing the aperture.) By these means, the Fresnel Scroll may be designed to function as both a tracking and focusing element, eliminating the need for supplementary focusing means.

Certain other restrictions implicit in the above descriptions are not essential to the invention's function and need not be included in the general specification. For example, although we have been implicitly equating the Fresnel film's "length" direction with its tracking direction (i.e., the directions in which it moves across the collector aperture), the film's dimension along the tracking direction may in some embodiments be shorter than its transverse dimension.

In the above illustrations, the Fresnel facet boundaries would form parallel lines running transverse to the tracking direction; but in general no restriction need be placed on the facet boundary geometry. Facets may be disposed on either the top or the bottom surface of the film, or on both surfaces. The only general structural constraint placed on the facet geometry is that the facet surface orientation should be nonuniform along the film's tracking direction, so that the facet surface orientation over any particular point on the aperture surface can be varied over a one-parameter range by scrolling the film across the aperture.

The aperture surface may in general have any shape which is deformable into a flat surface without stretching or shrinking (since a flat Fresnel film must be supported on the surface). For example, the aperture surface might comprise a section of a conical surface; in which case the Fresnel film would, when laid out flat, comprise a section of an annulus instead of the more usual rectangular shape.

General specification

In general, a Fresnel Scroll is specified as an optical mechanism comprising the following elements:

a support structure to which elements of the mechanism are attached (The structure may in some embodiments be fixed relative to the ground, whereas in other cases it may be mounted on a movable positioning system as in the configuration of FIG. 2.)

a thin flexible film F of optically transparent material bearing Fresnel facets on at least one side, wherein the geometric structure of the Fresnel facets on F is nonuniform along a designated tracking direction on F means for supporting a portion of F on a surface contour C spanning an aperture region, wherein C is fixed relative to the support structure (C may be flat or curved.)

translation means for moving F over some positional range, wherein the portion of F over the aperture region is constrained to remain on C, and wherein the set of points on F which can be brought into position over any particular point on C constitutes a curve on F (This latter condition serves to restrict the type of motion that that can be produced by the tracking mechanism, limiting the range of possible film positions relative to C to a one-parameter range. However, this restriction does not limit the range of film positions relative to any other reference base since the support structure to which C is fixed may itself be movable by means of another positional tracking mechanism. In the configuration of FIG. 2, for example, the Fresnel Scroll's translation means and the collector's rotational positioning mechanism function conjunctively to position F over a two-parameter positioning range relative to a ground-based reference.)

means for compactly stowing portions of F outside of the aperture region (e.g., by folding or rolling) and for dispensing and drawing in F as the translation means moves F over C. (Although the illustrated embodiments all use storage reels, any other practical method for compactly stowing the inactive film sections may alternatively be used.)

The nonuniformity of the Fresnel facet structure along the film's tracking direction allows the device's optical function to be dynamically varied in response to changes in the incident beam direction by scrolling the film across the aperture. By this means, the mechanism may either (case 1) function in combination with other elements of a two-axis tracking collector (in which F's translation means comprises one of the tracking axes) to accept any one of a two-parameter set of collimated incident beams and focus the beam substantially onto a point receiver; or (case 2) function alone or in combination with other elements of a one-axis tracking collector (in which F's translation means comprises the tracking axis) to accept any one of a two-parameter set of collimated incident beams and focus the beam substantially onto a line receiver. [The specification of a tracking collector as an "n-axis" system does not preclude the system from having more than n independent positioning degrees of freedom; however only n degrees of freedom would be required for the essential function of the device. The collector could not normally concentrate a collimated beam perfectly onto a point or line focus due to limitations imposed by factors such as optical aberrations; hence the specification only stipulates that the beam is focused "substantially" onto the receiver.]

Certain minor deviations from the above specification may be made without altering the device's essential form or function. For example, optical aberrations might be mitigated by incorporating a mechanism for slightly changing C's shape, or slightly moving F relative to C in a direction transverse to the designated tracking direction. To the extent that slight deviations of these types function only to marginally improve performance and are not requisite to the device's primary tracking function, the specification may be generalized somewhat to include such deviations. Thus, we will specify only that the contour C remains "substantially" fixed relative to the support structure into positions over any particular point on C "substantially" constitutes a curve on F (meaning that there will exist a curve on F associated with any particular point on C wherein the curve will be very close to, but not necessarily directly over, the point in any tracking position).

The geometric structure of the Fresnel facets is not explicitly defined above because, as illustrated by the design approach considered previously, a fairly arbitrary facet structure can be made to perform the intended tracking function. Certain specific restrictions may be placed on the system design parameters, however, in order to achieve the practical objectives of minimizing the Fresnel film's area and allowing the Fresnel Scroll to operate as a focusing lens as well as a tracking element. Several optimal system designs seating these objectives will be discussed below.

PREFERRED EMBODIMENTS

Two-axis point-focus collector employing one Fresnel Scroll

Figure 6:
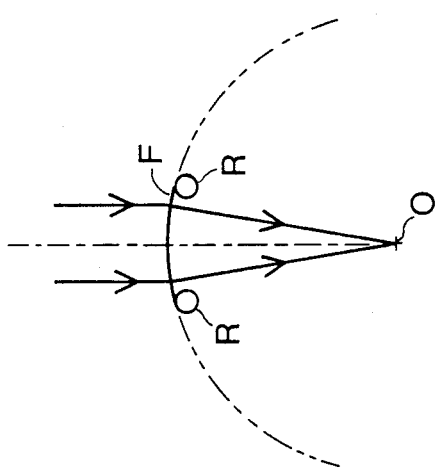
FIG. 6 illustrates a conceptual model for a two-axis point-focus collector employing one Fresnel Scroll.
Figure 7:
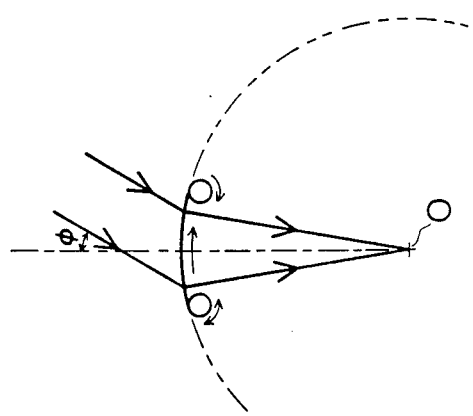
FIG. 7 illustrates the same model of FIG. 6 in a different tracking configuration.

We will now develop a collector design similar to the system illustrated in FIG. 2, but which is modified to meet the practical design objectives mentioned above. FIG. 6 illustrates a related design configuration which serves as a conceptual model for this system. The configuration of FIG. 6 comprises a rigid surface F of cylindrical shape, composed of transparent optical material and bearing Fresnel facets on one or both sides. The facet structure is defined so that a collimated beam incident from some particular direction is focused onto a point O on F's cylindrical axis. (If F is faceted on one side only, this functional specification determines the distribution of facet surface orientations over F uniquely; otherwise extra degrees of freedom will exist in the design which the designer may use to satisfy other design requirements or constraints.) If the beam and the apparatus are both rotated about the axis by some angle $\phi$ (FIG. 7), the beam will still be focused onto O; thus the device can be rotationally positioned to focus onto O any one of a set of collimated beams whose collimation directions all deviate from the cylindrical axis by the same polar angle. (Note: In order to avoid ambiguity, it will be implicitly understood in the following that one of the two directions parallel to a reference axis has been designated as the axial direction, and a beam's polar angle relative to the axis is defined as the angle between the axial direction and beam direction. This convention distinguishes beam directions associated with a particular polar angle $\theta$ from those directions associated with polar angle $180°-\theta$.)

Figure 8:
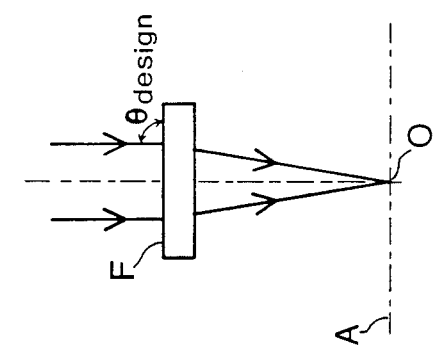
FIG. 8 illustrates two orthogonal views of a point-focus Fresnel Scroll element.
Figure 9:
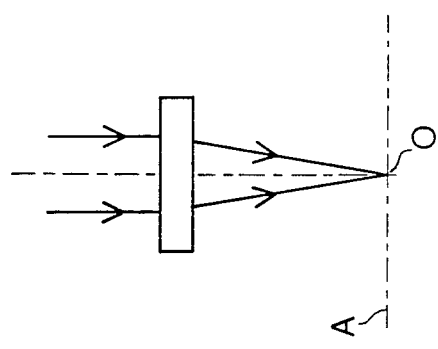
FIG. 9 illustrates the same element of FIG. 8 in a different tracking configuration.

A couple of modifications are made in the above design concept in order to arrive at the Fresnel Scroll design illustrated in FIG. 8: Rather than using a rigid optical element, the Fresnel element F is a thin, flexible film. The cylindrical shape of the film is maintained over a reduced aperture region above O by holding the film in tension across curved guide rails crossing the aperture below the film. The portions of the film outside of the aperture (corresponding to the phantom lines in FIGS. 8 and 9) are rolled up on two reels R. By scrolling the film between the two reels, the device can be made to concentrate any of a set of collimated beams, all having the same polar angle $\theta_{design}$ relative to the cylindrical axis A, onto the fixed focal point O as illustrated in FIG. 9.

The Fresnel Scroll system described above could function as part of a two-axis tracking system in which the entire collector assembly (i.e., the Fresnel Scroll, collector receiver, and support structure to which both are attached) would be mounted on a rotational positioning system which would rotate the assembly about a stationary rotational axis (as with the configuration of FIG. 2). The rotational positioning system serves to orient the system so that the fixed polar angle $\theta_{design}$ between the incident beam's collimation direction and the cylindrical axis is maintained.

One-axis line-focus collector employing a Fresnel Scroll

Figure 10:
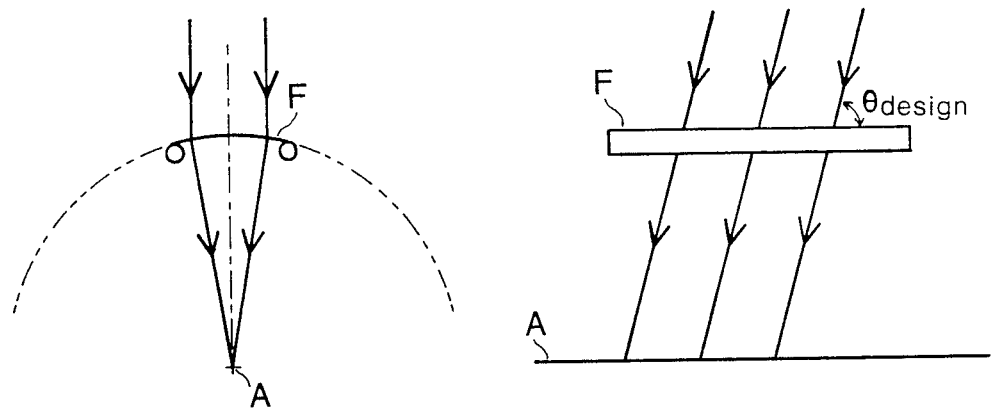
FIG. 10 illustrates two orthogonal views of a line-focus Fresnel Scroll element.
Figure 11:
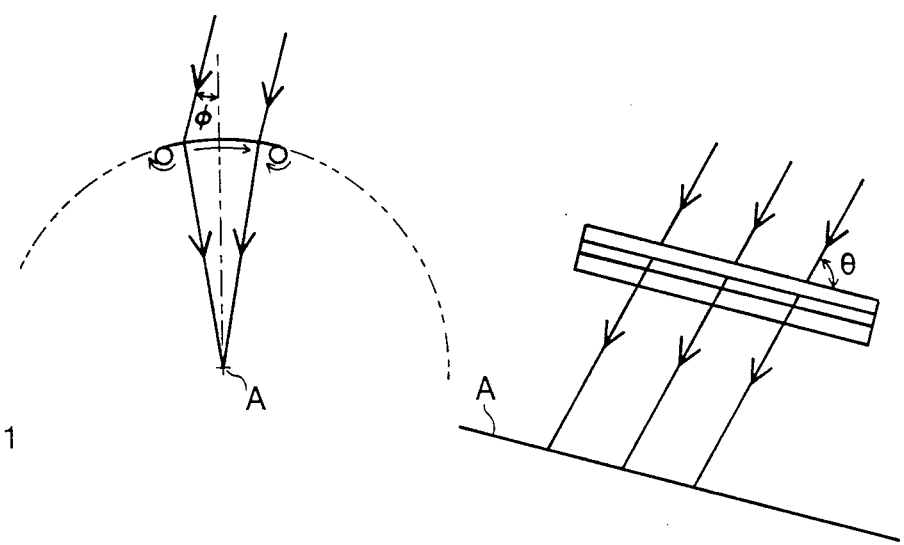
FIG. 11 illustrates the same element of FIG. 10 in a different tracking configuration.
Figure 12:
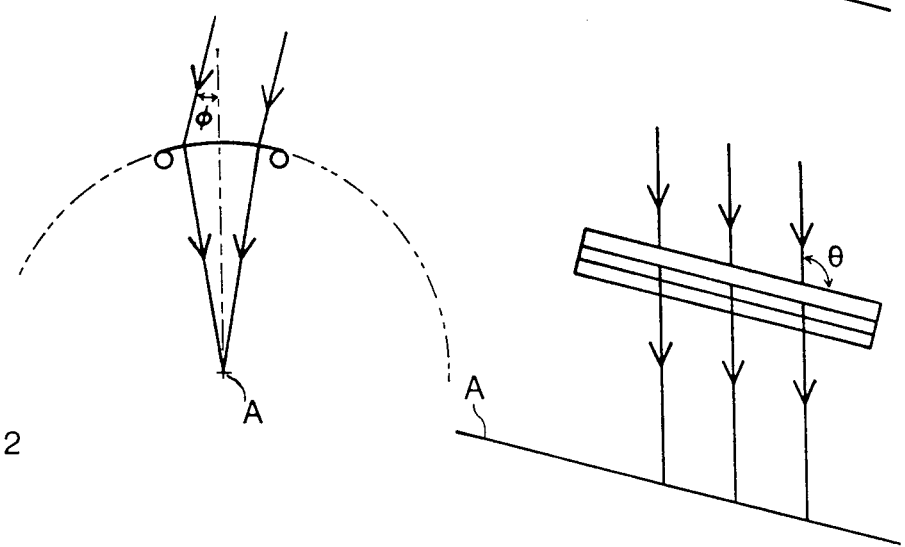
FIG. 12 illustrates the same element of FIG. 11 in another symmetrically-related tracking configuration.

FIG. 10 illustrates a line-focus Fresnel Scroll element which has a form similar to the point-focus device discussed above, the only difference being in the structure of the Fresnel facets. Rather than designing the facets to focus a collimated incident beam to a point, the facet structure is defined by the following specification: The facet geometry on F should have a constant cross-section in any intersecting plane perpendicular to the cylindrical axis A (this property is termed "translational symmetry" with respect to A's direction); and within this constraint, the distribution of facet surface orientations over F is defined so that with F fully extended on the cylindrical contour in a fixed tracking position (as indicated by phantom lines in FIG. 10; cf. FIG. 6), the rays of a particular collimated incident beam directed at some particular design angle $\theta_{design}$ relative to A will all be deflected onto A (but not all onto the same point on A, as in the point-focus design). Given this design specification, any other collimated beam whose polar angle $\theta$ relative to A is equal to the design angle $\theta_{design}$ can also be focused by F onto A by scrolling F into a tracking position correlated with the beam's azimuthal angle $\phi$ relative to A (FIG. 11). Moreover, due to the inherent symmetry of the facet structure (i.e., bilateral symmetry with respect to the plane of FIG. 10, left-hand view), the device will also produce a resolved line focus for beams having polar angle $\theta = 180°-\theta_{design}$ (FIG. 12). Thus, the device will show good line-imaging performance for at least two polar angles; and if these angles are not too far apart, reasonable performance may also be obtained for intermediate angles as well.

The system described above could function as the only movable element of a one-axis, line-focus collector, as in the configuration of FIG. 4; or it could operate in conjunction with a second Fresnel Scroll element in a two-axis point-focus system such as that of FIG. 3. A system of the latter type will now be discussed.

Two-axis point-focus collector employing two Fresnel Scrolls

Figure 13:
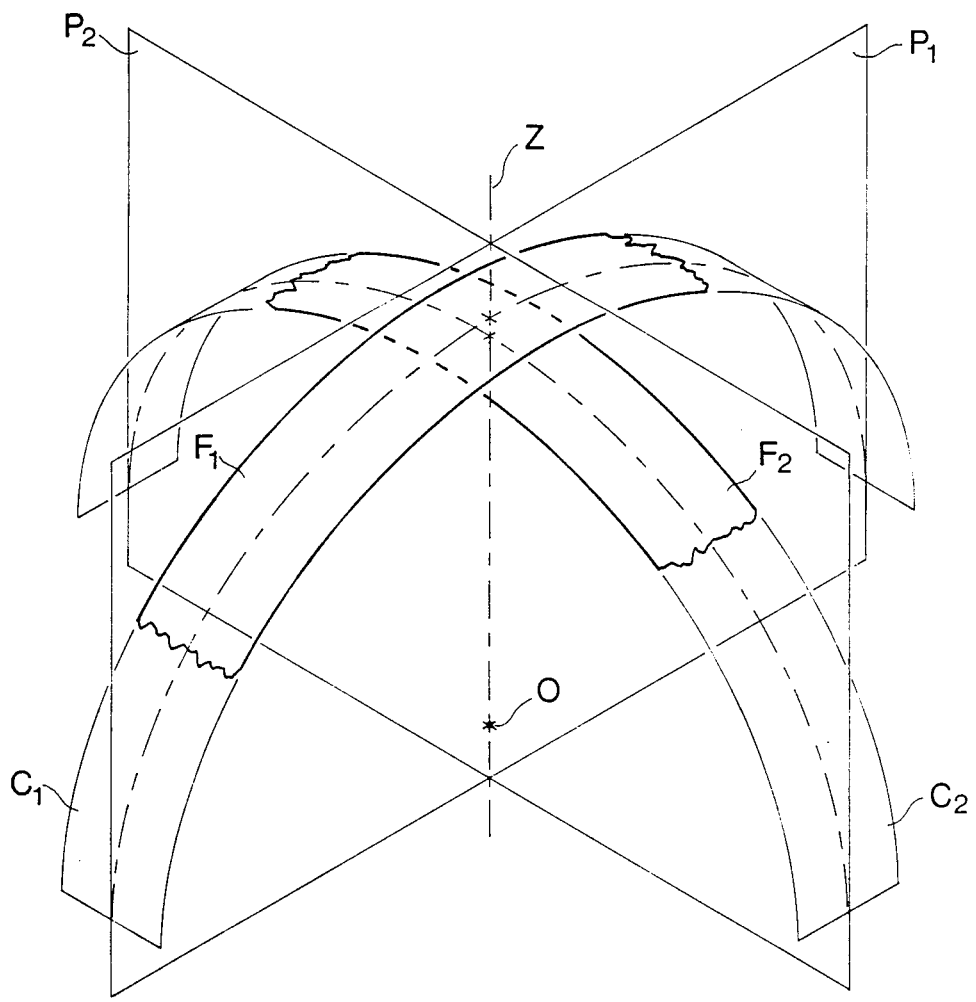
FIG. 13 illustrates schematically a two-axis point-focus collector employing two Fresnel Scrolls.

FIG. 13 schematically illustrates a point-focus collector which employs two Fresnel Scroll elements in series as in the FIG. 3 configuration. The two Fresnel films $F_1$ and $F_2$ are supported in tension across guide rails crossing an aperture region, with $F_1$ passing over $F_2$. The aperture is bounded by the region where $F_1$ passes over $F_2$, and portions of $F_1$ and $F_2$ outside of this region may be compactly rolled up on storage reels as in FIG. 3 (although they are shown fully extended in FIG. 13 for the purpose of illustration). In practice, $F_1$'s width dimension could be extended indefinitely to cover an entire row of $F_2$ elements, all linked to a common tracking drive.

The portion of $F_1$ passing over the aperture is constrained to a curved contour $C_1$. We define a plane of symmetry $P_1$ which bisects $F_1$ and is parallel to $F_1$'s tracking direction. ($F_1$ has bilateral symmetry across $P_1$.) $F_2$ is similarly configured: The portion of $F_2$ passing over the aperture is constrained to a curved contour $C_2$, and $F_2$ has bilateral symmetry across a plane $P_2$ parallel to $F_2$'s tracking direction. The two Fresnel Scroll elements are positioned in relation to each other so that $P_1$ and $P_2$ are mutually perpendicular. The line of intersection between $P_1$ and $P_2$ is designated Z in FIG. 13.

The system is designed to accept any one of a two-parameter set of collimated incident beams and, by scrolling $F_1$ and $F_2$ into appropriate tracking positions corresponding to the beam direction, focus the beam onto a designated receiver point 0 on Z. (It is not possible to form a perfect point focus with this system, but the design will be optimized to minimize point-imaging aberrations.) The correspondence between beam directions and tracking configurations is defined as follows: For each tracking configuration, we trace a ray from point 0 along Z through $F_2$ and $F_1$; and we determine the beam direction associated with this tracking configuration by reversing the ray's output direction. (Thus, at least one ray of each incident beam, the particular ray which intercepts $F_2$ on $F_2$'s Z-intercept, will be focused perfectly onto 0.) The positions of $F_1$ and $F_2$ in the tracking configuration associated with an incident beam direction parallel to Z will be designated as $F_1$'s and $F_2$'s "centered" positions. When scrolled into its centered tracking position, each Fresnel film $F_1$ or $F_2$ is not only symmetric relative to its own respective bilateral symmetry plane $P_1$ or $P_2$, but also possesses bilateral symmetry relative to the other symmetry plane as well (i.e., the tracking configuration associated with an incident beam direction parallel to Z possesses quadrilateral symmetry with respect to $P_1$ and $P_2$).

We will now define a couple of design conditions which will ensure perfect point-focusing performance, in any tracking configuration, for all rays which intercept $F_2$ along the curve where $P_2$ intersects $F_2$. Since the focal point 0 is on $P_2$, all such rays would be tangent to $P_2$ between $F_2$ and 0; and due to $F_2$'s bilateral symmetry across $P_2$, the section of each such ray between $F_1$ and $F_2$ would also be tangent to $P_2$. Hence, in any tracking configuration the rays intercepting $F_1$ along the line segment where $P_2$ intersects $F_1$ should each be deflected by $F_1$ in a direction tangent to $P_2$. This design requirement can be satisfied by constraining $F_1$ to have translational symmetry in the direction perpendicular to $P_1$ (i.e., $F_1$ should have a constant cross-section in any intersecting plane parallel to $P_1$ —this constraint can in fact be demonstrated as a necessary consequence of the above design requirement and $F_1$'s bilateral symmetry across $P_1$).

Figure 14:
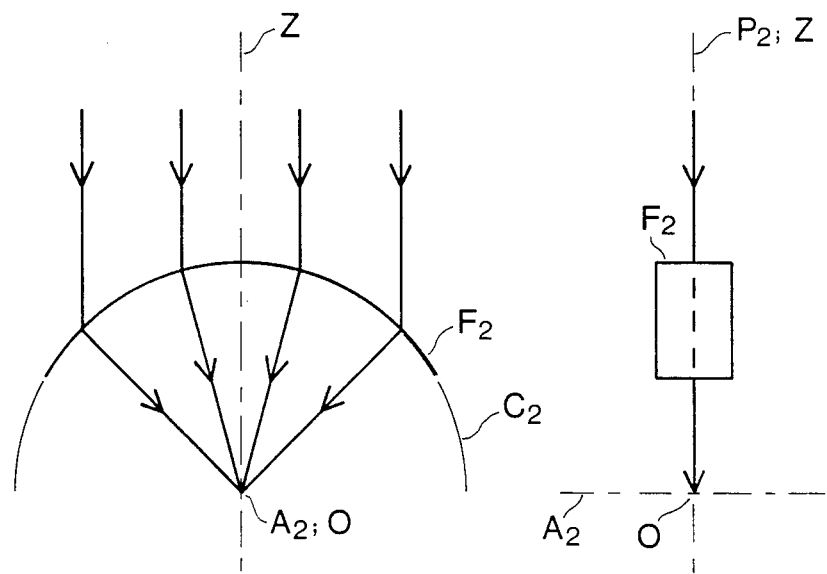
FIG. 14 illustrates two orthogonal views of the optical geometry of the bottom Fresnel Scroll element in FIG. 13.

Due to $F_1$'s translational symmetry, the facet surface orientation on $F_1$ will be constant on the line segment where $P_2$ intersects $F_1$; hence collimated rays intercepting this segment will remain collimated after transmitting through $F_1$. Thus, the cross-section of $F_2$ in $P_2$ will receive rays which are collimated tangent to $P_2$; and $F_2$ should be designed so that any such set of rays can be focused onto 0. This design requirement can be satisfied if $F_2$ meets the following partial design specification (see FIG. 14): $C_2$ is a cylindrical contour with its cylindrical axis $A_2$ intersecting Z at point 0; and with $F_2$ fully extended on $C_2$ in its centered tracking position, any ray in plane $P_2$ which impinges $F_2$'s top surface from a direction parallel to Z should be deflected by $F_2$ onto point 0. This facet geometry is identical to that of the point-focus system discussed previously (FIGS. 8 and 9, with $\theta_{design} = 90°$); except that $F_2$'s facet structure is presently only defined on $F_2$'s cross-section in $P_2$. It is evident from the conceptual illustrations in FIGS. 6 and 7 that $F_2$ can be scrolled across $C_2$ to focus onto 0 of any one of a set of collimated planar beams in $P_2$.

At this stage, we have partially constrained $F_1$'s design by imposing the translational symmetry constraint; we have specified the cross-sectional geometry of $F_2$ in $P_2$; and the design achieves perfect focusing of rays emerging from $F_2$ on $F_2$'s intersection with $P_2$. Next, we will extend the specification of $F_2$'s facet structure so that rays emerging from $F_2$ outside of $P_2$ are focused as well as possible onto 0. It will not be possible to achieve perfect focusing for all such rays simultaneously, but we can define the facet geometry on $F_2$ so that for each point on $F_2$'s Fresnel surface there will correspond at least one incident beam direction and associated tracking configuration for which the particular ray emerging from that point will be perfectly focused onto 0. (Other rays will not be focused exactly onto 0; but if the class of rays for which perfect focusing is achieved spans a wide enough range of incident beam directions and aperture intercept positions, then any ray in any tracking configuration will generally be close enough to some ray of this class in some nearby tracking configuration that reasonably good overall point-focusing performance will be attained.)

The specification of $F_2$'s facet structure is completed as follows: We suppose that a specification for $F_1$'s facet structure is provided ($F_1$'s structure will be defined below) and we define the facet surface orientation at any point p on $F_2$ by associating with p a specific tracking configuration and specifying that the particular ray intercepting p in the chosen tracking configuration is deflected by $F_2$ onto 0. The associated tracking configuration is chosen as follows: $F_1$ is in its centered position; and $F_2$ is positioned so that point p is located at its median aperture position. [The point's "median aperture position" is defined as follows: We identify a curve on $C_2$ consisting of points within the designated aperture bounds over which p can be positioned by moving $F_2$ over its tracking range; and we define p's median aperture position as the median point of this curve.] The specification of $F_2$'s facet structure given here is consistent with the former definition of $F_2$'s facet structure in $P_2$ but does not subsume it, because the facet surface orientation at p is determined from the direction of the ray incident on p in a particular tracking configuration; which is determined by the incident beam direction associated with that tracking configuration; which in turn is determined by the previously-defined Fresnel surface orientation at $F_2$'s Z-intercept.

The above specification defines a facet structure on $F_2$, given a specification of $F_1$'s structure (although the latter is as yet undefined), whereby the ray intercepting any particular point p on $F_2$ will be directed precisely onto 0 for at least one associated tracking configuration in which $F_1$ is centered. If $F_1$ can be designed so that the ray segment between $F_1$ and $F_2$ intercepting p remains stationary as $F_1$ deviates from its centered position (with $F_2$ held fixed and the inident beam direction varying to maintain the correspondence between beam direction and tracking configuration), then the variation of $F_1$'s position will not cause the ray intercepting p to deviate from the focal point 0; hence perfect focusing of the ray will be maintained over a one-parameter range of tracking configurations. We will now define a design specification for $F_1$ which will achieve this stationary-imaging condition for at least one particular position of $F_2$.

Figure 15:
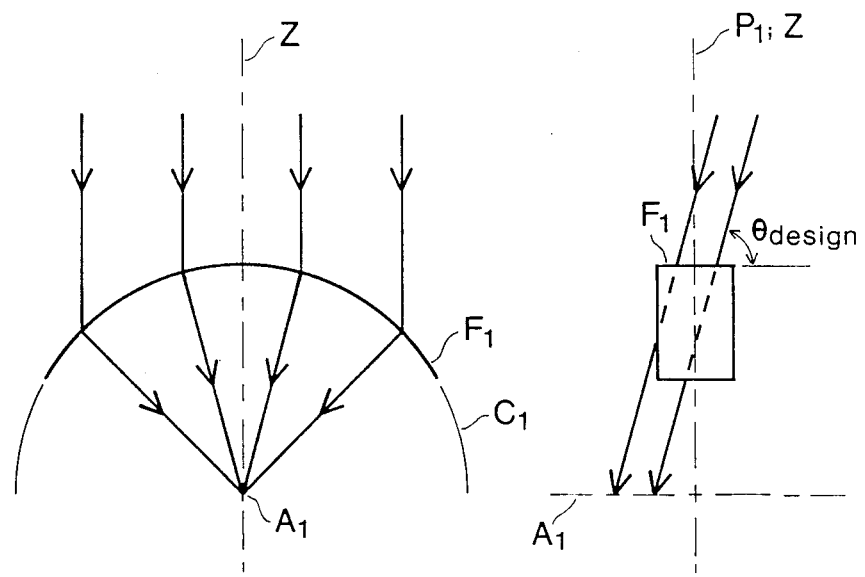
FIG. 15 illustrates two orthogonal views of the optical geometry of the top Fresnel Scroll element in FIG. 13.

In defining $F_1$'s structure, we choose a specific fixed design position of $F_2$, and we require that all incident beams associated with this tracking position be deflected by $F_1$ into a particular fixed beam between $F_1$ and $F_2$. Each fixed $F_2$ position is associated with a fixed direction of the ray impinging on $F_2$'s Z-intercept. This direction can be identified in terms of the ray's inclination angle relative to plane $P_1$. As a consequence of $F_1$'s translational symmetry, a ray's inclination angle relative to $P_1$ cannot change when the ray transmits through $F_1$; hence the incident beams associated with any fixed $F_2$ position will all have the same inclination angle relative to $P_1$, and $F_1$ should be designed so that any member of such a set of beams associated with $F_2$'s design position can be deflected by $F_1$ into some fixed beam. The design configuration illustrated in FIG. 15 satisfies this condition: $C_1$ is a cylindrical contour with its cylindrical axis $A_1$ intersecting Z. The direction of a ray impinging on $F_2'$-intercept in $F_2$'s design position may be identified in terms of the ray's polar angle $\theta_{design}$ relative to the $A_1$ axis; and the facet structure on $F_1$ is designed so that with $F_1$ fully extended on $C_1$ in $F_1$'s centered position, any ray impinging on $F_1$ from this direction is deflected by $F_1$ toward $A_1$. (Together with the requirement that $F_1$ possess translational symmetry, this functional specification determines $F_1$'s facet structure.) This design is identical to that of the line-focus element discussed previously (FIG. 10). As illustrated in FIGS. 11 and 12, $F_1$'s stationary imaging characteristic would apply not only to incident beams with a fixed polar angle $\theta = \theta_{design}$ relative to $A_1$, but also (by symmetry) to beams with a second polar angle $\theta = 180° - \theta_{design}$ corresponding to a second symmetrically-related design position of $F_2$ (the two design positions being equally displaced from $F_2$'s centered position); and if the system design is appropriately optimized, substantially stationary imaging may be obtained for intermediate polar angles and $F_2$ positions as well.

With the above design specifications, the collector system will focus a ray in the incident beam exactly onto 0 under the following conditions: Firstly, rays intercepting $F_2$ on $P_2$ will be focused perfectly in all tracking configurations. Secondly, the ray intercepting any point p on $F_2$ will be perfectly focused if $F_2$ is positioned with p at its median aperture position, and if at least one of the following two conditions applies: (1) the incident beam direction is parallel to $P_2$ (i.e., $F_1$ is in its centered position), or (2) the beam direction's polar angle relative to $A_1$ is either $\theta_{design}$ or $180° - \theta_{design}$ (i.e., $F_2$ is in one of the two symmetrically-related design positions). The rays in these categories cover a wide enough range of beam directions and aperture intercept locations that fairly good point-focusing performance may be obtained over the collector's full aperture and field of view. The system's free design parameters, including the aperture dimensions, the radii of the cylindrical contours $C_1$ and $C_2$, the displacement along Z between $C_1$ and $C_2$, and the beam angle $\theta_{design}$ associated with $F_2$'s design position, may be optimized (subject to certain functional and practical constraints) to minimize the system's point-imaging aberrations. (If no constraint is placed on $F_1$'s length dimension, the point-imaging aberrations can be reduced as much as desired by simply making $C_1$'s radius sufficiently large.)

I claim:
1. An optical mechanism comprising the elements of a support structure to which elements of the mechanism are attached
a thin flexible film F composed of an optically transparent material and bearing refractive Fresnel facets on at least one side, wherein the geometric structure of the Fresnel facets on F is nonuniform along a designated tracking direction on F,
means for supporting a portion of F on a surface contour C spanning an aperture region which is fixed relative to said support structure, wherein C is substantially fixed relative to said support structure,
translation means for moving F over some positional range, wherein
the portion of F over said aperture region is constrained to remain on C, and,
the set of points on F which can be brought into position over any particular point on C substantially constitutes a curve on F,
whereby F can be moved over a range of tracking positions so that any (optically functional) portion of F can be brought into position on C over said aperture region,
means for compactly stowing portions of F outside of said aperture region (e.g., by folding or rolling) and for dispensing and drawing in F as said translation means moves F across C,
wherein said translation means and said nonuniformity of the Fresnel facets allow the optical function of F to be varied in accordance with variations in the direction of an incident beam so that the mechanism may either
(case 1) function in combination with other elements of a two-axis tracking collector (wherein said translation means comprises one of the tracking axes) to accept any one of a two-parameter set of collimated incident beams and focus the beam substantially onto a point receiver, or,
(case 2) function alone or in combination with other elements of a one-axis tracking collector (wherein said translation means comprises the tracking axis) to accept any one of a two-parameter set of collimated incident beams and focus the beam substantially onto a line receiver.
2. An optical mechanism of claim 1 wherein
C is of cylindrical shape,
the curve of claim 1 consisting of points on F which can be positioned over any particular point on C is defined by the intersection of F with a plane perpendicular to C's cylindrical axis A,
the structure of the Fresnel facets on F is constrained by the following design criterion:
If F is positioned in a particular tracking position with F constrained (in its entirety) on C, then a first collimated beam which is directed at some particular angle $\theta_{design}$ to A and which intercepts F over F's entire optically functional area would be focused by the Fresnel facets toward a point 0 on a,
whereby said mechanism has the capability of accepting any second beam of a set of collimated incident beams which are all directed at the same angle $\theta_{design}$ to A and which intercept said aperture region, and positioning F by said translation means so that the portion of said second beam intercepting said aperture region is also focused toward 0.
3. An optical mechanism of claim 1 wherein
C is of cylindrical shape, the curve of claim 1 consisting of points on F which can be positioned over any particular point on C is defined by the intersection of F with a plane perpendicular to C's cylindrical axis A, the structure of the Fresnel facets on F is constrained by the following two design criteria:
1. The facet structure has translational symmetry with respect to A's direction,
2. If F is positioned in a particular tracking position with F constrained (in its entirety) on C, then a first collimated beam which is directed at some particular angle $\theta_{design}$ to A and which intercepts F over F's entire optically functional area would be focused by the Fresnel facets toward A, whereby said mechanism has the capability of accepting any second beam of a set of collimated incident beams which are directed either at the same angle $\theta_{design}$ to A or at an angle of $180°$-$\theta_{design}$ to A and which intercept said aperture region, and positioning F by said translation means so that the portion of said second beam intercepting said aperture region is also focused toward A.

4. A tracking collector comprising the elements of
a first mechanism of claim 1 (the first mechanism's film F is herein designated $F_1$ and its contour C is herein designated $C_1$) wherein $C_1$ is of cylindrical shape, with $C_1$'s cylindrical axis $A_1$ located below $C_1$, $F_1$ has bilateral symmetry with respect to a particular plane $P_1$ perpendicular to $A_1$, the curve of claim 1 consisting of points on $F_1$ which can be positioned over any particular point on $C_1$ is defined by the intersection of $F_1$ with a plane perpendicular to $A_1$, a second mechanism of claim 1 (the second mechanism's film F is herein designated $F_2$ and its contour C is herein designated $C_2$) wherein $C_2$ is of cylindrical shape, with $C_2$'s cylindrical axis $A_2$ located below $C_2$, $F_2$ has bilateral symmetry with respect to a particular plane $P_2$ perpendicular to $A_2$, the curve of claim 1 consisting of points on $F_2$ which can be positioned over any particular point on $C_2$ is defined by the intersection of $F_2$ with a plane perpendicular to $A_2$, wherein $C_2$ and $F_2$ are positioned in relation to $C_1$ and $F_1$ so that $C_2$ is between $C_1$ and $A_1$, $P_1$ contains $A_2$, and $P_2$ contains $A_1$, the structure of $F_1$'s Fresnel facets is constrained by the following two criteria:
1. The facet structure has translational symmetry with respect to $A_1$'s direction,
2. If $F_1$ is positioned in a designated centered tracking position with $F_1$ constrained (in its entirety) on $C_1$, then a collimated beam which is directed parallel to $P_2$ at some particular angle $\theta_{design}$ to $A_1$ and which intercepts $F_1$ over $F_1$'s entire optically functional area would be focused by $F_1$'s Fresnel facets toward $A_1$, the structure of $F_2$' Fresnel facets is constrained by the following two criteria:
1. If $F_2$ is positioned in a designated centered tracking position with $F_2$ constrained (in its entirety) on $C_2$, then rays in $P_2$ which are directed onto $F_2$'op surface from a direction parallel to a line Z defined by the intersection of $P_1$ and $P_2$ would be refracted by $F_2$ toward a focal point 0 at the intersection of $A_2$ and $P_2$,
2. If $F_1$ is positioned in its designated centered position and is illuminated by any collimated incident beam of claim 1 (case 1) which is directed parallel to $P_2$, and if $F_2$ is positioned so as to direct toward 0 the particular ray of the incident beam which (after transmitting through $F_1$) intercepts $F_2$ at the point where Z intercepts $F_2$, then any other ray of the incident beam which (after transmitting through $F_1$) intercepts $F_2$ at a point which is located at its median aperture position will be directed by $F_2$ toward 0, whereby said tracking collector can accept any collimated incident beam of claim 1 (case 1) and can be configured by said first mechanism's and said second mechanism's translation means so that any ray r of this incident beam will be directed toward 0 if r meets the following criterion:

After transmitting through $F_1$, either
r intercepts $F_2$ on $P_2$, or,
r intercepts $F_2$ at a point which is located at its median aperture position, and prior to transmitting through $F_1$, either
r is directed parallel to $P_2$ or,
r is directed at said angle $\theta_{design}$ or angle $180°$-$\theta_{design}$ relative to $A_1$, and wherein, moreover, said tracking collector's design parameters may be optimized so that rays in the incident beam which do not meet this criterion may also be directed substantially toward to 0.

* * * * *

UNITED STATES PATENT AND TRADEMARK OFFICE
CERTIFICATE OF CORRECTION

PATENT NO. : 4,765,726

DATED : Aug. 23, 1988

INVENTOR(S) : Kenneth C. Johnson

It is certified that error appears in the above-identified patent and that said Letters Patent is hereby corrected as shown below:

column 1, line 49: before "few" insert "a ".

column 1, line 54: "twoaxis" should read "two-axis".

column 2, line 41: "tacking" should read "tracking".

column 5, lines 56, 59 and 62: "$t_1,t_1$" should read "$t_1,t_2$".

column 6, line 6: "Section 2" should read "the Summary".

column 6, line 14: "retracts" should read "refracts".

column 6, line 51: "3" should read "2"; "4" should read "3".

column 7, line 33: " in Section 5" should be deleted.

column 8, line 22: "len's" should read "lens's".

column 8, lines 38-39: "Section 5" should read "The section on preferred embodiments".

column 9, line 4: "linefocus" should read "line-focus".

column 9, line 32: "directions" should read "direction".

column 10, line 68: after "structure" insert ", and that the set of points on F which can be brought".

column 11, lines 15-16: "seating" should read "meeting".

column 11, lines 38, 40, 56 and 64; column 13, lines 13, 19, 24, 39, 40, 60, 63 and 67; column 14, lines 4, 13, 19, 20, 35, 57 and 65; column 15, line 43; column 16, lines 58 and 66 ; and column 18, lines 19, 25, 31, 36 and 49: substitute the letter "O" for the numeral "0".

column 13, line 65: before "$F_2$'s" insert "on ".

column 14, line 4: delete "of ".

column 14, line 61: "inident" should read "incident".

UNITED STATES PATENT AND TRADEMARK OFFICE
CERTIFICATE OF CORRECTION

PATENT NO. : 4,765,726

DATED : Aug. 23, 1988

INVENTOR(S) : Kenneth C. Johnson

It is certified that error appears in the above-identified patent and that said Letters Patent is hereby corrected as shown below:

column 15, line 21: "$F_2$-intercept" should read "$F_2$'s Z-intercept".

column 16, line 59: "a" should read "A".

column 18, line 12: "$F_2$'Fresnel" should read "$F_2$'s Fresnel".

column 18, line 17: "$F_2$'op" should read "$F_2$'s top".

Signed and Sealed this

Thirty-first Day of January, 1989

Attest:

DONALD J. QUIGG

*Attesting Officer*   Commissioner of Patents and Trademarks